United States Patent
Banerjee et al.

(10) Patent No.: US 8,164,125 B2
(45) Date of Patent: Apr. 24, 2012

(54) INTEGRATED TRANSISTOR AND ANTI-FUSE AS PROGRAMMING ELEMENT FOR A HIGH-VOLTAGE INTEGRATED CIRCUIT

(75) Inventors: Sujit Banerjee, San Jose, CA (US); Martin H. Manley, Saratoga, CA (US)

(73) Assignee: Power Integrations, Inc., San Jose, CA (US)

( * ) Notice: Subject to any disclaimer, the term of this patent is extended or adjusted under 35 U.S.C. 154(b) by 180 days.

(21) Appl. No.: 12/800,096

(22) Filed: May 7, 2010

(65) Prior Publication Data

US 2011/0272758 A1 Nov. 10, 2011

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. .......... 257/288; 257/350; 257/E21.051; 257/E21.315; 257/E21.325; 257/E21.435; 257/E21.45

(58) Field of Classification Search ............ 257/288, 257/192, 312, 322, 329, 350, E21.051, E21.45, 257/E21.315, E21.325, E21.435
See application file for complete search history.

(56) References Cited

U.S. PATENT DOCUMENTS

| | | | |
|---|---|---|---|
| 5,282,107 A | 1/1994 | Balakrishnan | |
| 5,285,369 A | 2/1994 | Balakrishnan | |
| 6,388,853 B1 | 5/2002 | Balakrishnan et al. | |
| 6,635,544 B2 * | 10/2003 | Disney | 438/316 |
| 6,640,435 B2 | 11/2003 | Balakrishnan | |
| 6,668,451 B2 | 12/2003 | Balakrishnan | |
| 6,750,640 B2 | 6/2004 | Balakrishnan et al. | |
| 6,954,057 B2 | 10/2005 | Balakrishnan et al. | |
| 6,987,299 B2 * | 1/2006 | Disney et al. | 257/327 |
| 7,002,398 B2 | 2/2006 | Disney | |
| 7,170,756 B2 | 1/2007 | Balakrishnan | |
| 7,205,824 B2 | 4/2007 | Disney | |
| 7,221,011 B2 * | 5/2007 | Banerjee et al. | 257/288 |
| 7,227,733 B2 | 6/2007 | Balakrishnan et al. | |
| 7,308,754 B2 | 12/2007 | Balakrishnan | |
| 7,335,944 B2 * | 2/2008 | Banerjee et al. | 257/328 |
| 7,400,483 B2 | 7/2008 | Balakrishnan et al. | |
| 7,998,817 B2 * | 8/2011 | Disney | 438/270 |

* cited by examiner

*Primary Examiner* — David Nhu
(74) *Attorney, Agent, or Firm* — The Law Offices of Bradley J. Bereznak

(57) ABSTRACT

A semiconductor device includes an N type well region in a P type substrate. A source region of a MOSFET is laterally separated from a boundary of the well region, which includes the drain of the MOSFET. An insulated gate of the MOSFET extends laterally from the source region to at least just past the boundary of the well region. A polysilicon layer, which forms a first plate of a capacitive anti-fuse, is insulated from an area of the well region, which forms the second plate of the anti-fuse. The anti-fuse is programmed by application of a voltage across the first and second capacitive plates sufficient to destroy at least a portion of the second dielectric layer, thereby electrically shorting the polysilicon layer to the drain of the HVFET.

27 Claims, 4 Drawing Sheets

INTEGRATED TRANSISTOR AND ANTI-FUSE AS PROGRAMMING ELEMENT FOR A HIGH-VOLTAGE INTEGRATED CIRCUIT

TECHNICAL FIELD

The present disclosure generally relates to semiconductor processes for fabricating high-voltage integrated circuits with programmable electrical connections.

BACKGROUND

A common type of integrated circuit (IC) device is a metal-oxide-semiconductor field effect transistor (MOSFET). A MOSFET is a field-effect device that includes a source region, a drain region, a channel region extending between the source and drain regions, and a gate provided over the channel region. The gate includes a conductive gate structure disposed over the channel region. The conductive gate is typically insulated from the channel region by a thin oxide layer.

High-voltage, field-effect transistors (HVFETs) are also well known in the semiconductor arts. Many HVFETs employ a device structure that includes an extended drain region, also known as the drift region, that supports or "blocks" the applied high-voltage (e.g., 150 volts or more) when the device is in the "off" state. HVFETs in a high-voltage integrated circuit (HVIC) process are commonly formed as lateral device structures where source and drain are on the top surface of the semiconductor die. The channel and the drift regions separate the source from the drain. The gate over the channel region is used to switch the HVFET on or off and the drift region supports the drain voltage. The length of the drift region between the channel and the drain determines the maximum voltage that the device can support. Devices with different voltage capabilities can be integrated in the same HVIC process by modifying the drift length. In the context of the present application, a medium-voltage device refers to voltages in the range of 50V to 150V. A medium voltage FET can be integrated in the same HVIC process that has the HVEFT that can support voltages higher than 150V.

The operating characteristics of a high voltage or power IC device is typically set or programmed by selectively opening (or closing) one or more electrical connections. A zener diode is one type of electrical element used to trim or program analog parameters (e.g., frequency) of a power IC device. A zener diode provides a normally off or non-conducting electrical connection. To change the conducting state of the zener element a high voltage (>10 V) is typically applied to breakdown the zener, with the large resulting current (150-200 mA) shorting the anode and cathode terminals of the zener permanently. The cumulative current flowing through the zener elements may be used to program one or more analog parameters. For example, based on the state of one or more zener elements, an analog parameter such as frequency may be set within a specified tolerance in the controller section of the power IC.

BRIEF DESCRIPTION OF THE DRAWINGS

The present disclosure will be understood more fully from the detailed description that follows and from the accompanying drawings, which however, should not be taken to limit the invention to the specific embodiments shown, but are for explanation and understanding only.

DESCRIPTION OF EXAMPLE EMBODIMENTS

Figure 1:
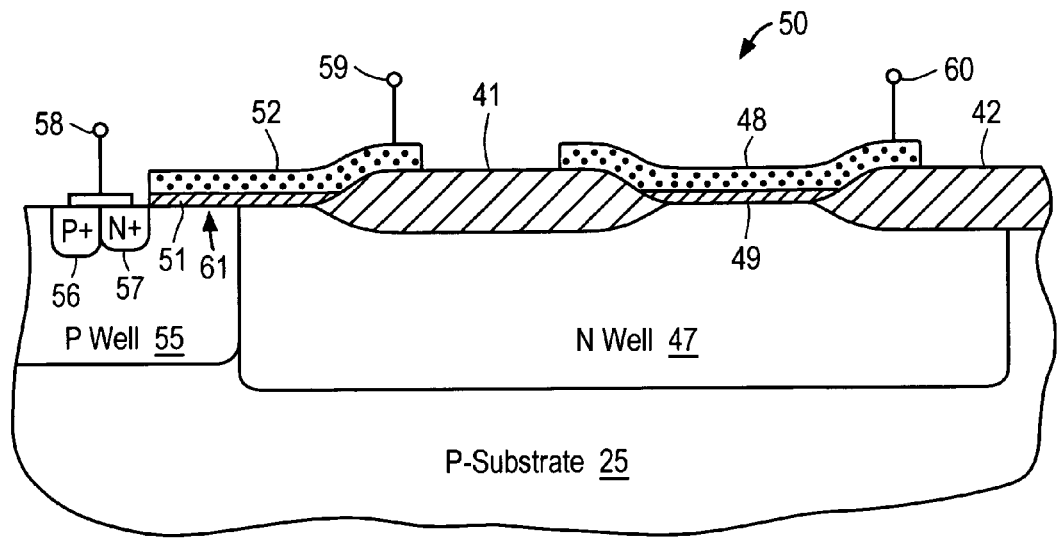
FIG. 1 illustrates an example cross-section of a programming element comprising an integrated transistor and anti-fuse device structure.

A novel integrated anti-fuse device structure is disclosed. In the following description specific details are set forth, such as material types, voltages, structural features, manufacturing steps, etc., in order to provide a thorough understanding of the disclosure herein. However, persons having ordinary skill in the relevant arts will appreciate that these specific details may not be needed to practice the embodiments described. References throughout this description to "one embodiment", "an embodiment", "one example" or "an example" means that a particular feature, structure or characteristic described in connection with the embodiment or example is included in at least one embodiment. The phrases "in one embodiment", "in an embodiment", "one example" or "an example" in various places throughout this description are not necessarily all referring to the same embodiment or example. Furthermore, the particular features, structures or characteristics may be combined in any suitable combinations and/or sub-combinations in one or more embodiments or examples.

It should be understood that the elements in the figures are representational, and are not drawn to scale in the interest of clarity. It is also appreciated that although an IC utilizing mostly N-channel transistor devices (both high-voltage and low-voltage) are disclosed, P-channel transistors may also be fabricated by utilizing the opposite conductivity types for all of the appropriate doped regions.

In the context of the present application, a high-voltage or power transistor is any semiconductor transistor structure that is capable of supporting 150 volts or more in an "off" state or condition. A medium-voltage transistor is a semiconductor transistor structure that is capable of supporting 50V to 150V. As used herein, a power transistor is any semiconductor transistor structure that is capable of supporting 50V to 150V, or higher. A power transistor or power semiconductor device may refer to both medium-voltage and high-voltage transistors. A power IC or power IC device denotes a semiconductor device that includes medium-voltage and/or high-voltage transistor devices. In one embodiment, a high-voltage transistor or medium-voltage transistor is illustrated as an N-channel metal oxide semiconductor field-effect transistor (MOSFET) with the voltage being supported by the drift region between the source and drain regions.

For purposes of this disclosure, "ground" or "ground potential" refers to a reference voltage or potential against which all other voltages or potentials of a circuit or IC are defined or measured. A "pin" provides a point of external electrical connection to an IC device or package, thereby allowing external components, circuits, signals, power, loads, etc., to be coupled to the internal components and circuitry of the power IC device.

As used herein, an anti-fuse is a circuit element that provides a normally open electrical connection in a device structure like that of a capacitor, with two or more layers of metal, polysilicon, or doped semiconductor material separated by a dielectric layer (e.g., oxide, nitride, etc.). The electrical connection between the two layers of metal can be permanently closed by applying a large voltage across the metal conductors which acts to break down or destroys the dielectric layer, thereby electrically shorting the two metal layers.

Figure 2:
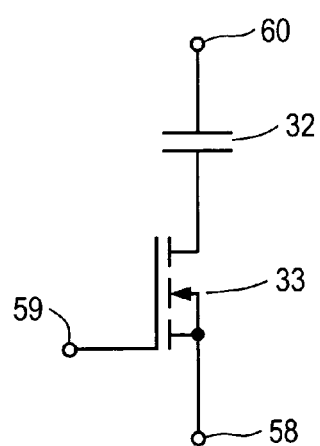
FIG. 2 is an equivalent circuit schematic diagram of the integrated device structure shown in FIG. 1.

FIG. 1 illustrates an example cross-section of one embodiment of an anti-fuse programming element 50 that includes an integrated medium or high-voltage field-effect transistor (HVFET) switching device and anti-fuse device structure. FIG. 2 is an equivalent circuit schematic diagram of the integrated device structure shown in FIG. 1. As can be seen, the anti-fuse capacitor 32 shown in FIG. 2 comprises a polysilicon layer 48 that is separated from an underlying N-type well region 47 by a thin dielectric (e.g., gate oxide) layer 49 (see FIG. 1). Polysilicon layer 48 and N-well region 47 form the two plates of the capacitive anti-fuse structure. N-well region 47 also forms the extended drain or drift region of MOSFET 33.

A source electrode 58 provides an electrical connection with N+ source region 57 and P+ region 56, both of which are disposed in a P-type well region 55 that adjoins N well region 47. A source electrode 58 is shown being electrically connected to both N+ source region 57 and P+ region 56. In other embodiments, P+ region 56 may be spaced-apart from N+ source region 57 such that source electrode 58 only connects with N+ source region 57. An area of P well region 55 forms a channel region 61 of MOSFET 33 that laterally separates N+ source region 57 from the boundary or edge between P well region 55 and N well region 47. The gate of MOSFET 33 comprises a polysilicon layer 52 that is insulated from the underlying P-type substrate 25 and N+ well region by a thin dielectric (e.g., gate oxide) layer 51. A gate electrode 59 provides an electrical connection with polysilicon layer 52.

A programming or trimming HV pulse may be applied to anti-fuse programming element 50 at node 60 which provides an electrical connection with polysilicon layer 48. Before applying the programming HV pulse to node 60, gate electrode 59 is raised to a high potential (to turn on MOSFET 33) and source electrode 58 is connected to ground (e.g., through a low-impedance switch). In one embodiment, the programming voltage pulse is in a range of 30-50 V. The programming voltage depends on the thickness of dielectric layer 49. When the programming voltage pulse is applied, dielectric layer 49 separating the two terminals or capacitive plates ruptures, resulting in a permanent short between polysilicon layer 48 and N well region 47, thereby programming the anti-fuse structure.

Prior to programming, anti-fuse programming element 50 does not pass any current between electrodes 60 and 58 when a positive voltage is applied to gate electrode 59 to turn MOSFET 33 on; that is, it appears as an open circuit to a normal D.C. operating voltage (e.g., VDD=5-6 V). Once anti-fuse programming element 50 has been programmed, and a positive voltage is applied to gate electrode 59 (to turn on MOSFET 33), anti-fuse programming element 50 behaves as a resistor having a resistance typically on the order of a few thousand ohms.

Practitioners in the art will appreciate that the amount of current required to trim or program anti-fuse programming element 50 is significantly smaller as compared to existing zener diodes, which normally require >150 mA. A typical current for programming element 50 is in the range of 0.1 mA to 2 mA. Additionally, persons of skill in the art will understand that the integrated anti-fuse device structures disclosed herein may reduce the overall size of the trimming block of a power IC device by a factor of about five or more as compared to prior art designs.

In one implementation, MOSFET 33 is designed to have a breakdown voltage of approximately 50 V, whereas dielectric layer (e.g., gate oxide) 49 of the capacitive anti-fuse structure is manufactured to have a breakdown voltage of about 25V.

Figure 3:
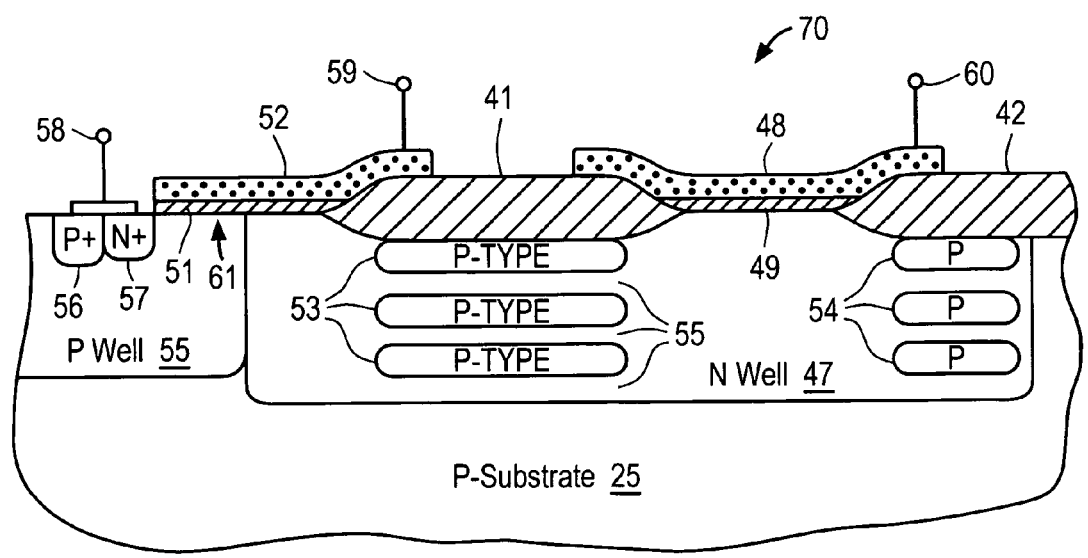
FIG. 3 is an example cross-section of another anti-fuse device structure.

FIG. 3 illustrates an example cross-section of another integrated anti-fuse programming element 70. The device structure shown in the example of FIG. 3 is identical to that of FIG. 1, except that anti-fuse programming element 70 also includes a first plurality of substantially-parallel, vertically spaced-apart P-type buried regions 53 disposed in the left-hand area of N well 47 beneath relatively thick dielectric (e.g., field oxide) layer 41. A corresponding plurality of JFET conduction channels 55 are shown formed by the vertical spacing of buried regions 53. A second plurality of substantially-parallel, vertically spaced-apart P-type buried regions 54 is shown disposed in the right-hand area of N well 47 beneath thick field oxide layer 42. The uppermost buried regions are shown coincident with field oxide regions 41 & 42 on the left and right-hand sides of N well 47, respectively. In other embodiments, the uppermost buried regions may be disposed a distance beneath with field oxide regions 41 & 42, such that a JFET conduction channel is formed between the uppermost buried region and the corresponding field oxide region.

As can be seen, P-type buried regions 53 and 54 do not extend laterally beneath thin oxide layers 51 or 49. In one embodiment, a deep implant (not shown) or any other type of equivalent structure may be used to electrically connect each of buried regions 53 & 54. This allows P-type buried regions 53 and 54, which comprise the gate of the JFET, to be electrically connected (along with source electrode 58) to a potential at or near ground when anti-fuse programming element 50 is intended to be left untrimmed or open. It is appreciated that the inclusion of P-type buried regions 53 and 54 is an optional feature in the integrated anti-fuse programming element described herein. In addition, although three buried regions 53 (and three buried regions 54) are shown in the example of FIG. 3, persons of ordinary skill in the art will understand that the number of vertically spaced-apart P-type buried regions 53 and 54 may vary in different embodiments, ranging from one (a single buried region) to six or more.

Figure 4:
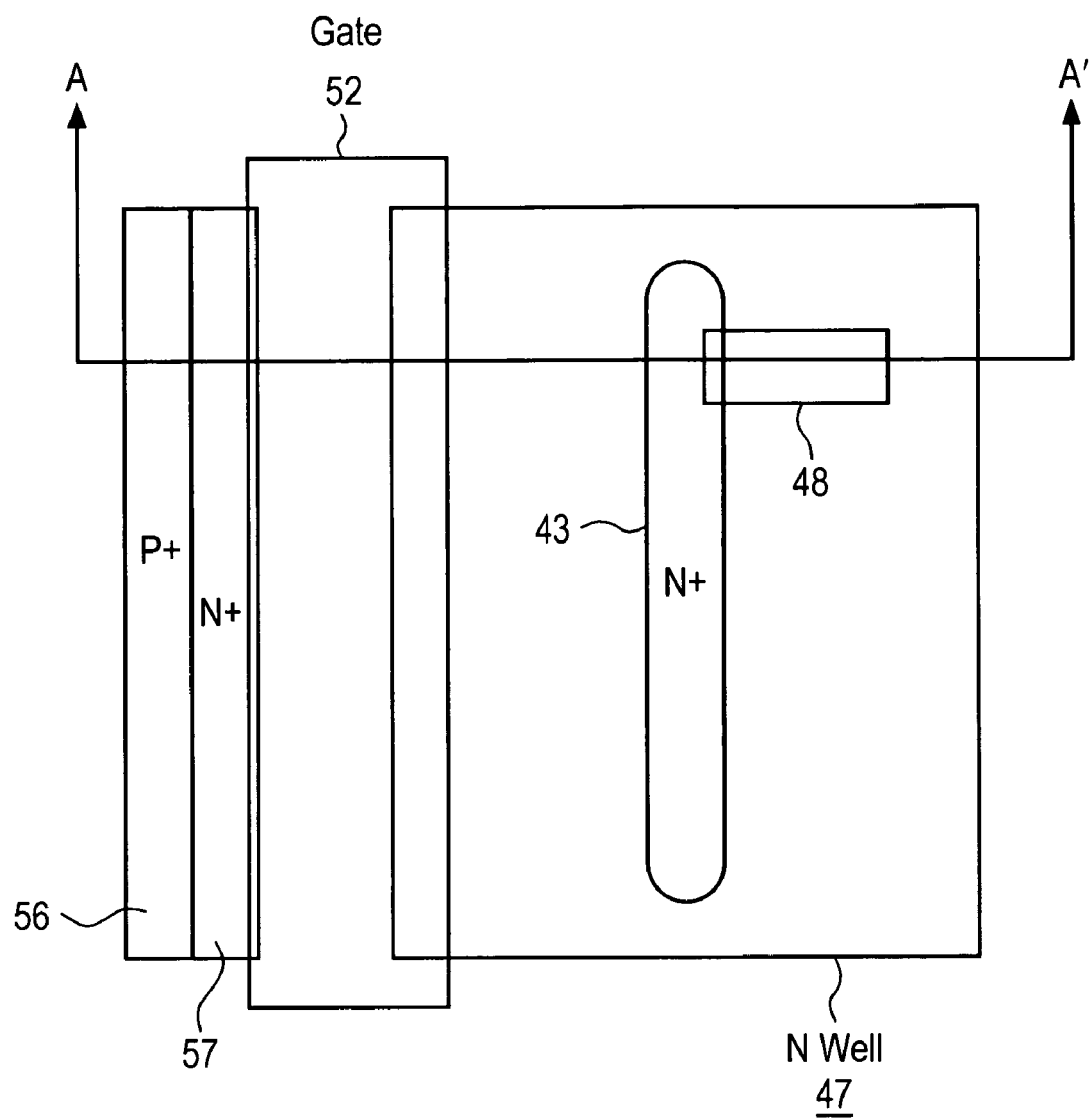
FIG. 4 is a top view of an example circuit layout of another anti-fuse device structure.
Figure 5:
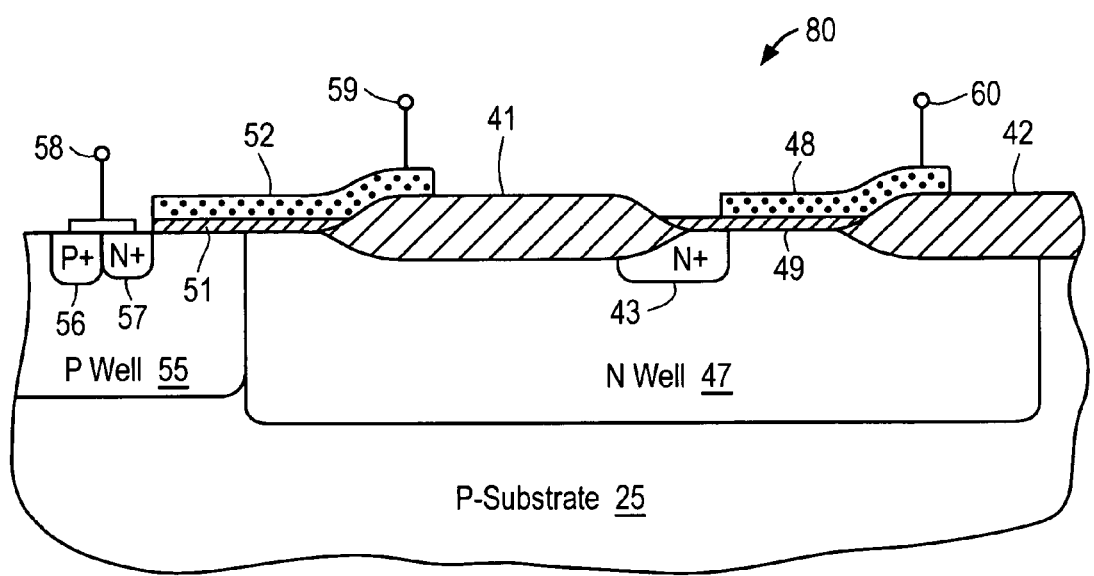
FIG. 5 is an example cross-section of the anti-fuse device structure shown in FIG. 4 taken through cut lines A-A'.

FIG. 4 is a top view of an example circuit layout of another anti-fuse device structure. FIG. 5 is an example cross-section of the anti-fuse device structure shown in FIG. 4 taken through cut lines A-A'. As shown, anti-fuse programming element 80 includes the same basic elements shown in the device structure of FIG. 1, and further includes a heavily-doped N+ region 43 disposed in N well 47 partially beneath thin dielectric (oxide) layer 49 and partially beneath the tapered edge of thick field oxide layer 41. Polysilicon layer 48 is shown disposed over dielectric layer 49, but extending just slightly over one side of N+ region 43. Practitioners in the semiconductor arts will appreciate that N+ region 43 may be formed self-aligned with respect to polysilicon layer 48.

It is further appreciated that any of the embodiments shown in FIGS. 1-5 may be manufactured with two MOSFET gate structures disposed on opposite lateral sides of the N well region, instead of the single gate structures illustrated by way of example. For example, the embodiment shown in FIG. 5 may be fabricated with two MOSFET gate structures located on opposite sides of N well 47, both equidistant from N+ region 43.

It should also be understood that another variation of the device structure shown in FIG. 5 may comprise one or more vertically spaced-apart P-type buried regions separated from N+ region 43 and disposed beneath field oxide layer 41 (and optionally also under field oxide layer 42) in a manner similar to that shown in the example of FIG. 3.

Although the present invention has been described in conjunction with specific embodiments, those of ordinary skill in the arts will appreciate that numerous modifications and alterations are well within the scope of the present invention. Accordingly, the specification and drawings are to be regarded in an illustrative rather than a restrictive sense.

We claim:

1. A semiconductor device comprising:
   a substrate of a first conductivity type;
   a first well region of a second conductivity type disposed in the substrate;
   a second well region of the first conductivity type disposed in the substrate adjacent to the first well region;
   a first region of the second conductivity type disposed in the second well region, the first region being laterally separated by a channel region from a boundary where the first well region adjoins the second well region, the first region comprising a source of a MOSFET;
   a first conductive layer insulated from a first area of the substrate by a first dielectric layer, the first dielectric layer extending laterally over the channel region from the first region to at least just past the boundary over a first area of the first well region, the first conductive layer comprising a gate of the MOSFET and the first well region comprising a drift region of the MOSFET;
   a second conductive layer insulated from a second area of the first well region by a second dielectric layer, the first dielectric layer and the second dielectric layer being laterally separated at a surface of the substrate by a thick dielectric layer, the second conductive layer comprising a first capacitive plate, the second area of the first well region comprising a second capacitive plate, a third area of the first well region being disposed beneath the thick dielectric layer, the third area separating the first and second areas of the first well region;
   wherein the semiconductor device is programmed by application of a first voltage on the gate sufficient to turn on the MOSFET, and a second voltage on the first capacitive plate sufficient to destroy at least a portion of the second dielectric layer, thereby electrically connecting the source of the MOSFET to the first capacitive plate.

2. The semiconductor device of claim 1 further comprising one or more first buried regions of the first conductivity type disposed within the third area of the first well region, the one or more first buried regions being vertically spaced-apart to define junction field-effect transistor (JFET) conduction channels in the third area of the first well region.

3. The semiconductor device of claim 2 further comprising one or more second buried regions of the first conductivity type disposed within a fourth area of the first well region adjacent the second area, the one or more second buried regions being vertically spaced-apart from one another.

4. The semiconductor device of claim 2 wherein an uppermost one of the first buried regions adjoins the thick dielectric layer.

5. The semiconductor device of claim 2 wherein the conduction channels are defined between each of the first buried regions, and also between a bottommost one of the first buried regions and the substrate.

6. The semiconductor device of claim 1 further comprising a second region of the first conductivity type, the second region being disposed in the second well region adjacent the first region.

7. The semiconductor device of claim 1 wherein the first conductivity type is P-type and the second conductivity type is N-type.

8. The semiconductor device of claim 6 further comprising:
   a source electrode electrically connected with the first and second regions;
   a gate electrode electrically connected with the first conductive layer; and
   an anti-fuse electrode electrically connected with the second conductive layer.

9. The semiconductor device of claim 1 further comprising a second region of the second conductivity type disposed in the first well region between the first and second areas, the second region comprising a drain region of the MOSFET.

10. The semiconductor device of claim 1 wherein the first and second dielectric layers comprise oxide.

11. The semiconductor device of claim 2 wherein the one or more first buried regions are coupled to the first region.

12. A high-voltage device comprising:
   a substrate of a first conductivity type;
   a well region of a second conductivity type disposed in the substrate;
   a first region of the second conductivity type laterally separated from a boundary of the well region by a channel region, the first region comprising a source of a high-voltage field-effect transistor (HVFET);
   a first conductive layer insulated from the channel region by a first dielectric layer having a first thickness, the first dielectric layer extending laterally over the channel region from the source to at least just past the boundary over a first area of the well region, the first conductive layer comprising a gate of the HVFET and the well region comprising a drift region of the HVFET;
   a second conductive layer insulated from a second area of the well region by a second dielectric layer having a second thickness, the first dielectric layer and the second dielectric layer being laterally separated at a surface of the substrate by a third dielectric layer having a third thickness substantially greater than either the first or second thickness, the second conductive layer comprising a first capacitive plate of an anti-fuse, the second area of the well region comprising a second capacitive plate of the anti-fuse, a third area of the well region being disposed beneath the third dielectric layer, the third area separating the first and second areas of the well region;
   wherein the anti-fuse is programmed by application of a first voltage on the gate sufficient to turn on the HVFET, and a second voltage on the first capacitive plate sufficient to destroy at least a portion of the second dielectric layer, thereby electrically connecting the source of the HVFET to the first capacitive plate.

13. The high-voltage device of claim 12 further comprising one or more first buried regions of the first conductivity type disposed within the third area of the well region, the one or more first buried regions being vertically spaced-apart to define junction field-effect transistor (JFET) conduction channels in the third area of the well region.

14. The high-voltage device of claim 13 further comprising one or more second buried regions of the first conductivity type disposed within a fourth area of the well region adjacent the second area, the one or more second buried regions being vertically spaced-apart from one another.

15. The high-voltage device of claim 12 further comprising a second well region of the first conductivity type disposed in the substrate laterally adjacent the well region, the source and channel region being disposed in the second well region.

16. The high-voltage device of claim 13 wherein the JFET conduction channels are defined between each of the first buried regions, and also between a bottommost one of the first buried regions and the substrate.

17. The high-voltage device of claim 15 further comprising a second region of the first conductivity type, the second region being disposed in the second well region adjacent the first region.

18. The high-voltage device of claim 12 wherein the first conductivity type is P-type and the second conductivity type is N-type.

19. The high-voltage device of claim 17 further comprising:
- a source electrode electrically connected with the first and second regions;
- a gate electrode electrically connected with the first conductive layer; and
- an anti-fuse electrode electrically connected with the second conductive layer.

20. The high-voltage device of claim 12 wherein the first and second conductive layers comprise polysilicon.

21. The high-voltage device of claim 12 wherein the first and second dielectric layers comprise oxide.

22. The high-voltage device of claim 12 wherein the third dielectric layer comprises a field oxide.

23. The high-voltage device of claim 12 wherein the first and second dielectric thicknesses are substantially equal.

24. A power semiconductor device comprising:
- a substrate of a first conductivity type;
- a first well region of a second conductivity type disposed in the substrate;
- a second well region of the first conductivity type disposed in the substrate adjacent to the first well region;
- a first region of the second conductivity type disposed in the second well region, the first region being laterally separated by a channel region from a boundary where the first well region adjoins the second well region, the first region comprising a source of a MOSFET;
- a gate of the MOSFET disposed over and insulated from the channel region;
- a conductive layer disposed over and insulated from a second area of the first well region by a first dielectric layer, the conductive layer comprising a first capacitive plate, the second area of the first well region comprising a second capacitive plate;
- a second region of the second conductivity type disposed in the first well region, the second region adjoining the second area and being partially covered at a surface of the substrate by the first dielectric layer, the second region comprising a drain of a MOSFET;
- a second dielectric layer that laterally adjoins the first dielectric layer at the surface of the substrate and partially covers the second region, the second dielectric layer being substantially thicker as compared to the first dielectric layer; and
- wherein the power semiconductor device is programmed by application of a first voltage on the gate sufficient to turn on the MOSFET, and a second voltage on the first capacitive plate sufficient to destroy at least a portion of the first dielectric layer, thereby shorting the drain of the MOSFET to the first capacitive plate.

25. The power semiconductor device of claim 24 further comprising a third region of the first conductivity type, the third region being disposed in the second well region adjacent the first region.

26. The power semiconductor device of claim 24 wherein the first conductivity type is P-type and the second conductivity type is N-type.

27. The power semiconductor device of claim 24 further comprising:
- a source electrode electrically connected with the first region;
- a gate electrode electrically connected with the gate; and
- an anti-fuse electrode electrically connected with the conductive layer.

* * * * *